United States Patent [19]

Blauvelt et al.

[11] Patent Number: 5,179,461
[45] Date of Patent: Jan. 12, 1993

[54] BROADBAND OPTICAL RECEIVER WITH PASSIVER TUNING NETWORK

[75] Inventors: Henery A. Blauvelt; Israel Ury, both of Los Angeles; David B. Huff, Downey; Howard L. Loboda, Los Angeles, all of Calif.

[73] Assignee: Ortel Corporation, Alhambra, Calif.

[21] Appl. No.: 598,547

[22] Filed: Oct. 16, 1990

Related U.S. Application Data

[63] Continuation-in-part of Ser. No. 280,388, Dec. 6, 1988, abandoned.

[51] Int. Cl.⁵ .............................................. H04B 10/6
[52] U.S. Cl. ..................................... 359/189; 330/308; 330/165; 333/32
[58] Field of Search ............... 455/619, 287, 290, 292; 358/86; 250/206, 227.21, 551; 370/1, 3; 330/305, 306, 308, 59, 165, 166, 171; 359/152–154, 168, 189; 333/32, 33

[56] References Cited

U.S. PATENT DOCUMENTS

| | | | |
|---|---|---|---|
| 1,822,061 | 9/1931 | Van Braan Roberts | 359/189 |
| 3,551,855 | 12/1970 | Seidel | 333/33 |
| 4,045,777 | 8/1977 | Mierzwinski et al. | 359/154 |
| 4,295,225 | 10/1981 | Pan | 455/601 |
| 4,659,981 | 4/1987 | Lumsden | 330/165 |
| 4,789,213 | 12/1988 | Heywang et al. | 359/150 |
| 4,859,015 | 8/1989 | Krinsky et al. | 455/619 |
| 5,010,399 | 4/1991 | Goodman et al. | 359/146 |
| 5,029,240 | 7/1991 | de La Chapelle et al. | 455/619 |
| 5,029,306 | 7/1991 | Bull et al. | 359/154 |
| 5,089,787 | 2/1992 | Wang et al. | 359/162 |

FOREIGN PATENT DOCUMENTS

| | | | |
|---|---|---|---|
| 53-033083 | 3/1978 | Japan . | |
| 0215231 | 9/1988 | Japan | 455/619 |
| WO88/01813 | 3/1988 | PCT Int'l Appl. . | |
| WO88/05234 | 7/1988 | PCT Int'l Appl. . | |

OTHER PUBLICATIONS

"Autotransformers vs Two-Winding Transformers: A system Comparison" GE; Howard Swenson, Sep. 1972.
"Fiber-Optic . . . Cable TV Applications" Cotten and Patisaul, SPIE vol. 139 Guided Wave Optical Sys. & Dev. 1978.

Primary Examiner—Edward L. Coles, Sr.
Assistant Examiner—Jill Jackson
Attorney, Agent, or Firm—Christie, Parker & Hale

[57] ABSTRACT

This optical receiver is capable of receiving broadband R-F modulated signals transmitted over fiber-optic cable. The receiver comprises a photodiode impedance matched to the input of an low noise, low distortion amplifier by an impedance matching transformer. A passive tuning network is placed between the photodiode and the transformer to improve the high frequency performance of the receiver. Distortion of the optical receiver is further reduced by cancelling even power distortion products from out of phase signals generated by the photodiode.

35 Claims, 9 Drawing Sheets

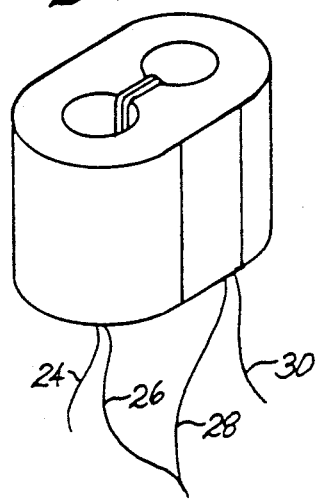
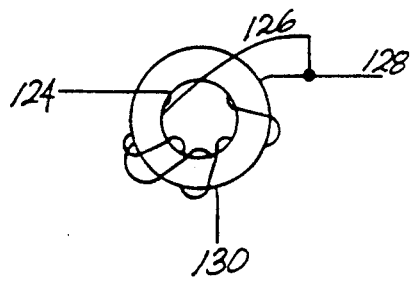
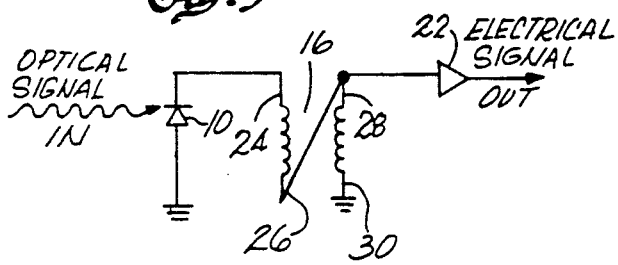
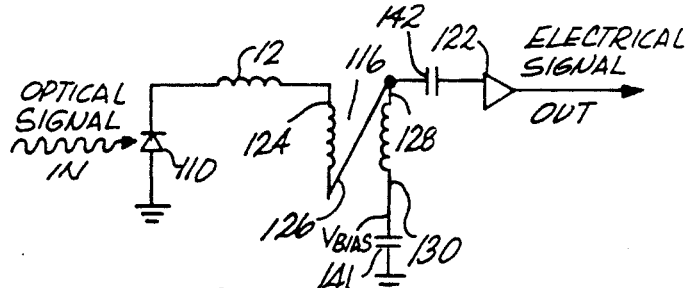
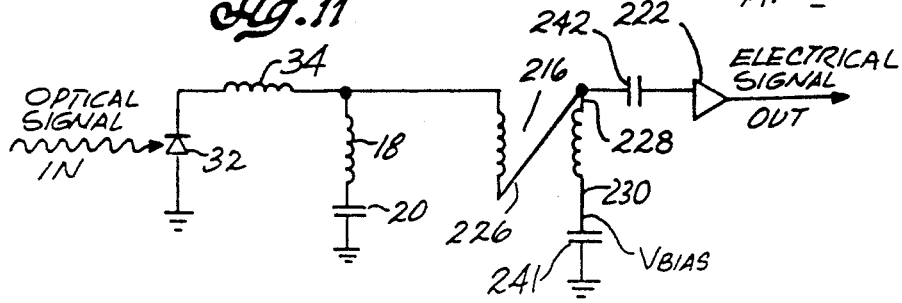

BROADBAND OPTICAL RECEIVER WITH PASSIVER TUNING NETWORK

This is a continuation-in-part of application Ser. No. 07/280,388, filed Dec. 6, 1988 now abandoned. The subject matter of which is hereby incorporated by reference.

BACKGROUND

The present invention relates generally to the conversion of modulated light to electrical signals and more particularly, to reception of broadband radio-frequency (R-F) modulated signals including signals found in multichannel amplitude modulated (AM) television distribution systems transmitted through fiber optic cable.

Serviceable optical receivers now exist for fiber-optic audio and digital communications systems. However, there is a lack of inexpensive, low distortion, low noise optical receivers for R-F fiber-optic cable transmitted signals. In the U.S. broadband cable television signals are amplitude modulated and include the frequencies from 50 MHz to 550 MHz. Other systems use frequencies as high as 860 MHz, and systems have been proposed for frequencies of up to 1 GHz. As alternatives to transmission of AM television signals through fiber-optic cable, frequency modulated (FM) and digitally encoded television signals have been demonstrated. However, such alternatives to AM transmission are not competitive with existing wire cable television systems because of the equipment needed to encode and decode the television signal. AM transmission of television through fiber-optic cable requires an optical receiver which can amplify the received signal with very low distortion and which adds a minimum amount of noise.

Prior art optical receivers have specially designed low noise amplifiers connected directly to photodiodes. However, such optical receivers are used primarily for transmission of digital communication and have more inherent distortion than is permissible for the transmission of broadband AM signals.

This invention provides an inexpensive practical optical receiver which operates with broadband signals over the R-F frequencies of from 10 MHz to more than 1 GHz. The invention overcomes the noise and distortion problems associated with fiber-optic cable receivers and is designed to operate with low cost, commercially available amplifiers.

SUMMARY OF THE INVENTION

The present invention is an R-F optical receiver with a photodetector for converting a broadband R-F optical signal to a broadband R-F electrical signal. The output of the photodetector has a high impedance which is matched to the low impedance input of the receiver's amplifier by an impedance matching network.

In a preferred embodiment the optical receiver comprises a photodiode connected in series with an inductor, which together are connected to the input of a transformer. The output of the transformer is connected to a cable television amplifier with input and output impedances of 50 or 75 ohms. The inductor and transformer provide an effective matching of the impedance of the photodiode with the input impedance of the amplifier.

In another embodiment, the photodiode produces two signals 180° out of phase. Each signal is thereafter amplified using nearly balanced amplifiers and re-combined to provide an RF output. By adjusting the degree to which the amplifiers are unbalanced, the second order distortion products generated by the photodiode are largely cancelled, resulting in a low distortion RF output. A transformer and passive tuning network provide an effective matching of the impedance of the photodiode with the input impedance of each amplifier.

BRIEF DESCRIPTION OF THE DRAWINGS

FIG. 1 is a block diagram of an embodiment of the invention;

FIG. 3 is a perspective view of a transformer assembly used in the invention;

FIG. 4 is a perspective view of an alternate transformer assembly;

FIG. 5 is a schematic diagram of a circuit showing another embodiment of the invention;

FIG. 7 is a schematic diagram of a preferred embodiment of the invention;

FIG. 11 is a schematic diagram of a second preferred embodiment of the invention;

DETAILED DESCRIPTION

Optical receivers consist minimally of a photodetector for converting an optical signal to an electrical signal and an amplifier for boosting the electrical signal to a level suitable for use, such as for driving a television receiver. To be practical for reception of AM television signals, the receiver must provide gain without inducing any significant additional distortion and add as little noise as possible.

Optical receiver photodetectors are generally either a PIN type diode or an avalanche photodiode. Avalanche photodiodes amplify the received signal but add excess noise. They are generally useful for very low received power levels, but their excess noise makes them inferior for the higher power levels of fiber-optic cable systems. Referring to FIGS. 5, 7 and 11, a low capacitance (0.2 pF), high speed indium gallium arsenide PIN diode is used as the photodiode 10. This photodiode is a high impedance device in the range of 2,000 ohms.

An exemplary amplifier 22 is a hybrid cable television amplifier such as a Motorola MHW 6171. This amplifier is inexpensive and has a gain factor sufficient to drive the input of a television receiver, a frequency range of from 10 MHz to 550 MHz, a noise figure of less than 8 dB and distortion at least 50 dB below the signal level. However, this amplifier also has a low impedance input. To make better use of this and similar cable television amplifiers, means are needed to match the high impedance of the photodiode to the low impedance of the amplifier over the broadband cable television frequency spectrum. In a preferred embodiment this impedance matching is achieved by the use of an impedance matching transformer and a passive tuning network. The passive tuning network may be one or more discrete or distributed capacitors, inductors and resistors.

Figure 2:
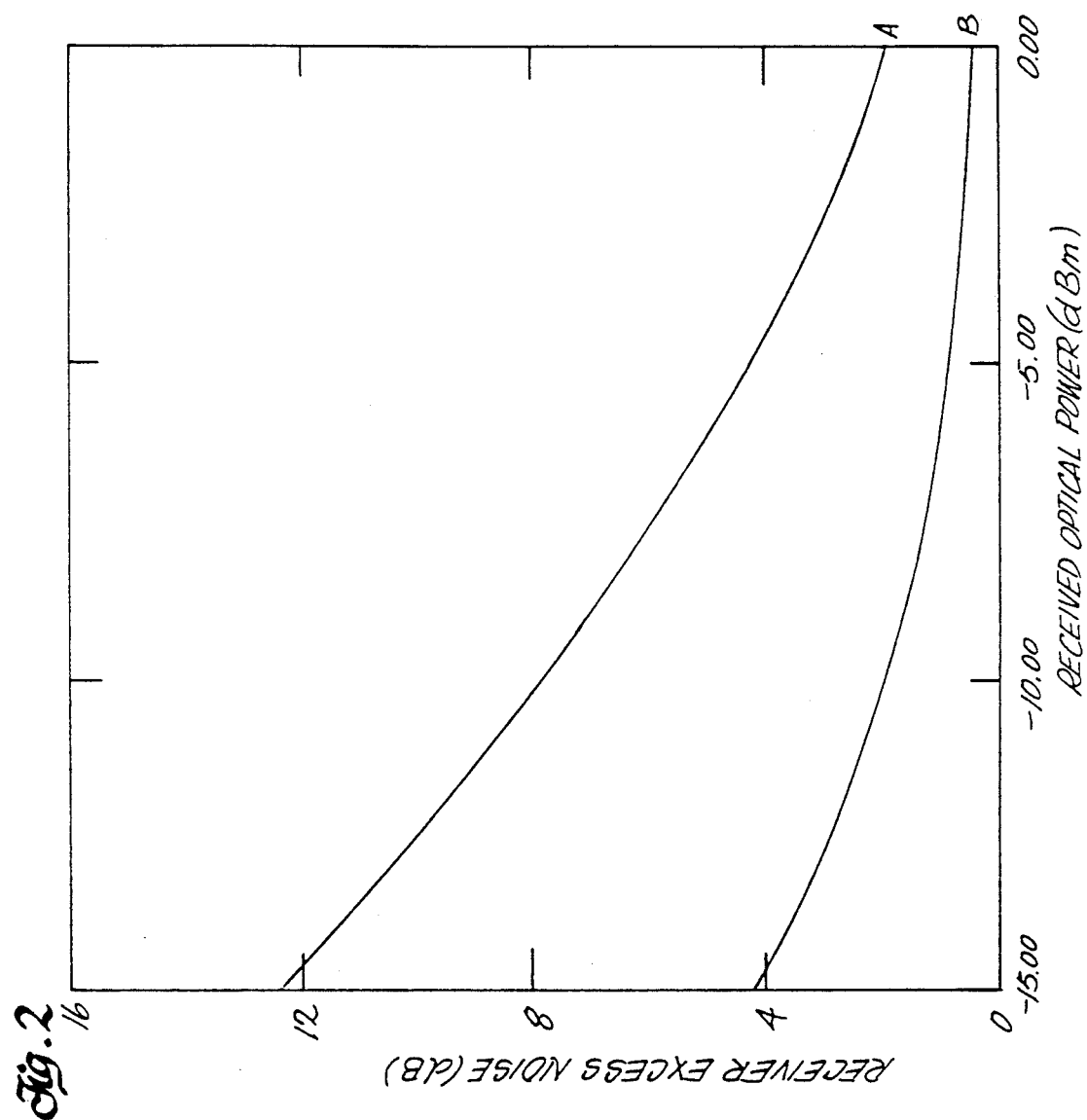
FIG. 2 is a graph showing performance of an embodiment with and without the impedance matching means shown in FIG. 1.

All optical receivers have output noise due to the shot noise associated with the current generated by the photodiode, also referred to as quantum noise. The optimization of the receiver requires that the quantum limit be approached as closely as possible. In practice of this invention the incorporation of impedance matching circuitry between the photodiode and the amplifier significantly reduces the noise in excess of the quantum limit. The optical receiver operates within one decibel (dB) of the quantum limit while introducing negligible distortion for received optical power levels between −6 decibel milliwatts (dBm) and 0 dBm. This is the normal range of received power of fiber-optic links transmitting AM television signals. The excess noise over the quantum limit is shown in FIG. 2, for the first preferred embodiment of the invention described below. Line "A" in FIG. 2 is the relative amount of excess noise without impedance matching. Line "B" shows the relative improvement obtained after adding impedance matching circuitry.

The simplest impedance matching means is a transformer 16. The transformer may have various input and output impedance ratios ranging from 2:1 to 100:1, with a preferred ratio of 12:1 to 20:1 for operation with R-F frequencies from 10 MHz to 550 MHz.

The transformer has two windings wrapped on a ferrite core, which may be of various shapes. Two preferred shapes are binocular and toroidal as shown in FIGS. 3 and 4, respectively. The binocular shaped core may be purchased from Fair-Rite Products Corporation, Wallkill, N.Y. 12589, as Part No. 2873002302. The first winding is made by wrapping 0.004 to 0.009 inch diameter, enamel insulated wire one to ten times around the core web between the two openings in FIG. 3. Six wraps are preferred for the first winding. The second end 26 of the first winding wire is connected to the first end 28 of a second similar wire. The second wire is wrapped in the same direction as the first, one to six times around the core web to create the secondary winding. Two wraps are preferred for the second winding. The interconnected wires 26 and 28 are connected to the input of the amplifier 22. The first end 24 of the first winding wire is connected to one electrode of the photodiode, and the second end 30 of the second winding is connected to ground as shown in FIG. 5.

FIG. 4 shows a toroidal transformer which may be used in the invention in place of the binocular type shown in FIG. 3. This transformer has two windings wrapped on a ferrite core 32 available from Fair-Rite as Part Number 2673000101. As with the binocular transformer various impedance ratios may be used with the preferred ratio being 16:1. The first winding is made by wrapping 0.004 to 0.009 inch diameter, enamel insulated wire one to ten times around the core as shown in FIG. 4. Six wraps are preferred for the first winding. The second end of the first winding wire 126 is connected to the first end of a second similar wire 128. The second wire is wound one to six times around the core overlapping the first winding. As with the binocular transformer, above, interconnected wires 126 and 128 are connected to the input of the amplifier. The first end 124 of the first winding is connected to one electrode of the photodiode. The second end 130 of the secondary winding is connected to ground.

Figure 6:
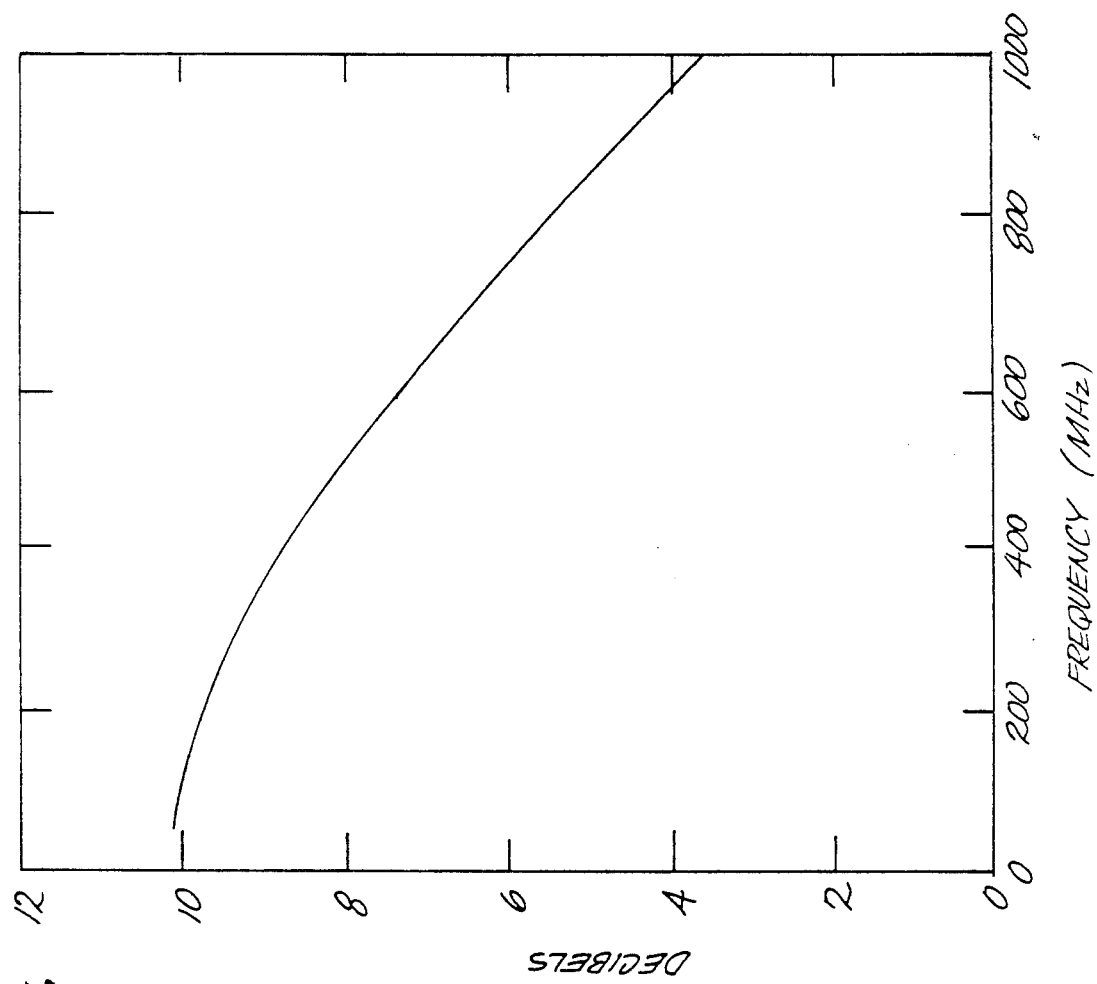
FIG. 6 is a graph showing performance of the embodiment shown in FIG. 5.

Performance for the embodiment shown in FIG. 5, with a transformer having a 16:1 impedance ratio, has been calculated and plotted in FIG. 6. As can be seen, there is considerable gain at 10 MHz, but gain is continually reduced as frequency is increased to 550 MHz.

To improve impedance matching at frequencies above 10 MHz, a series inductor 12 is added to the circuit between the photodiode and the first winding of the transformer as shown in FIG. 7. The balance of the components shown in FIG. 7 are similar to and perform similarly to those shown in FIG. 5. They are labeled with the same reference numerals as similar components in FIG. 5, except that 100 has been added to each one. For example, transformer 16 in FIG. 5 corresponds to transformer 116 in FIG. 7. In a like manner similar components in FIG. 11, discussed below, have 200 added to each one.

The value of the series inductor 12 in FIG. 7 may range between 20 nano Henrys (nH) and 1000 nH. The series inductor causes inductive peaking in the circuit. The various values of the series inductor shift the frequency at which the peaking will occur. In the embodiment shown in FIG. 7, when a 230 nH series inductor is selected the maximum gain of the circuit occurs at about 500 MHz.

A capacitor 142 is connected in series between the interconnected wires 126 and 128 and the input to the to the amplifier 122.

Also, one electrode of a capacitor 141 is connected to the second end 130 of the secondary winding of the transformer 116. The other electrode of the capacitor 141 is connected to ground. A bias voltage $V_{BIAS}$ is also applied to the second end 130 of the secondary winding.

Figure 8:
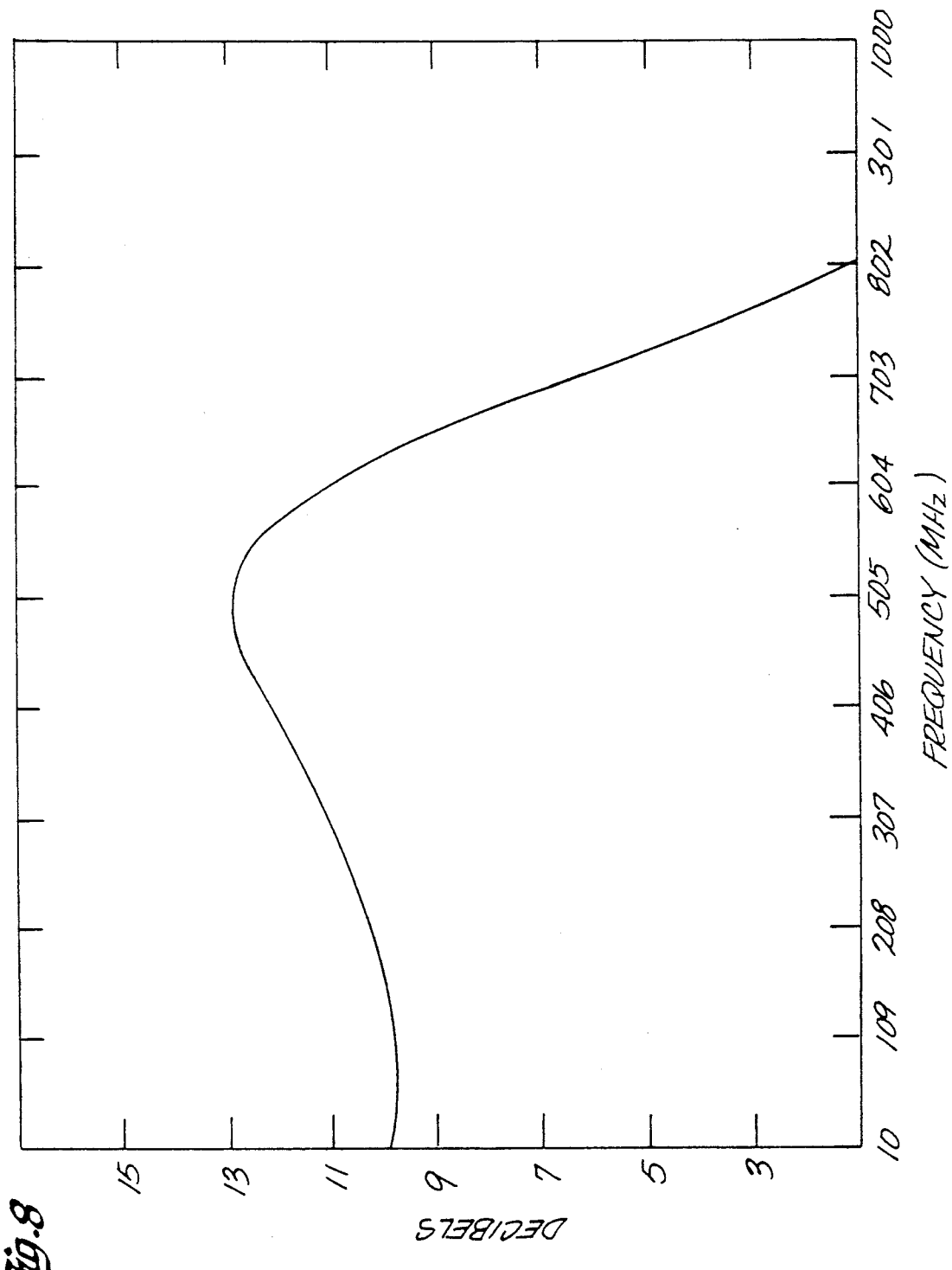
FIG. 8 is a graph showing performance of the embodiment shown in FIG. 7.

Performance of this circuit has been tested and plotted in FIG. 8. The 230 nH series inductor placed in the circuit results in a positive slope (tilt) over the television frequency spectrum from near 50 MHz to about 550 MHz followed by a negative tilt at higher frequencies. The positive tilt of the gain at broadband cable television frequencies is not an undesirable characteristic because other portions of the cable television system cause some attenuation of the higher frequencies.

An embodiment of the invention utilizing a 230 nH series inductor and 16:1 ratio transformer provides from a 10 to 13 dB signal increase of the received signals over the frequency range of from 10 MHz to 550 MHz.

Figure 9:
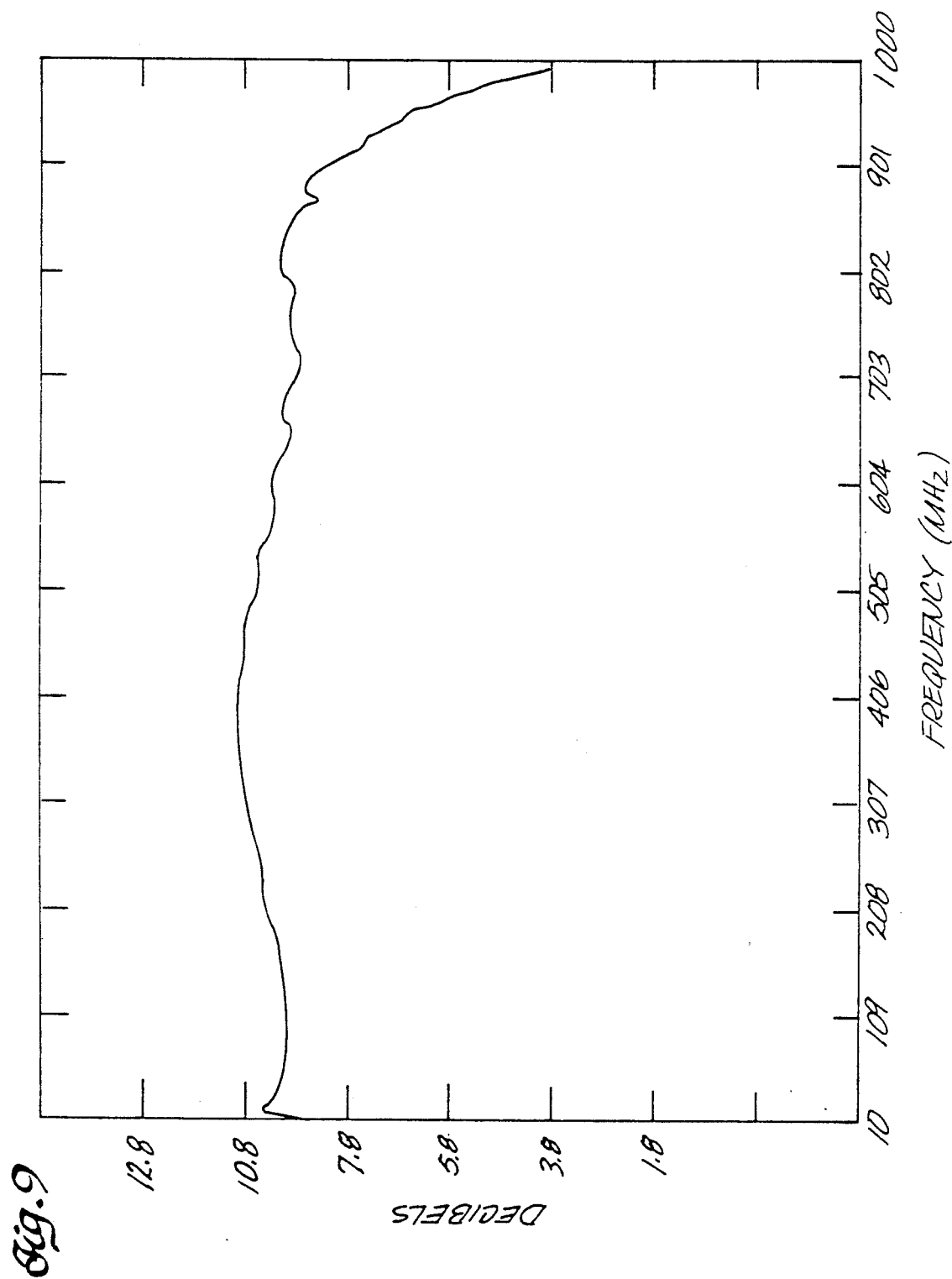
FIG. 9 is a graph showing performance of another embodiment of FIG. 7.

As can be seen in FIG. 9, the use of a 130 nH series inductor and a 12:1 ratio transformer results in a relatively flat frequency response for the optical receiver from 10 MHz to 900 MHz.

Figure 10:
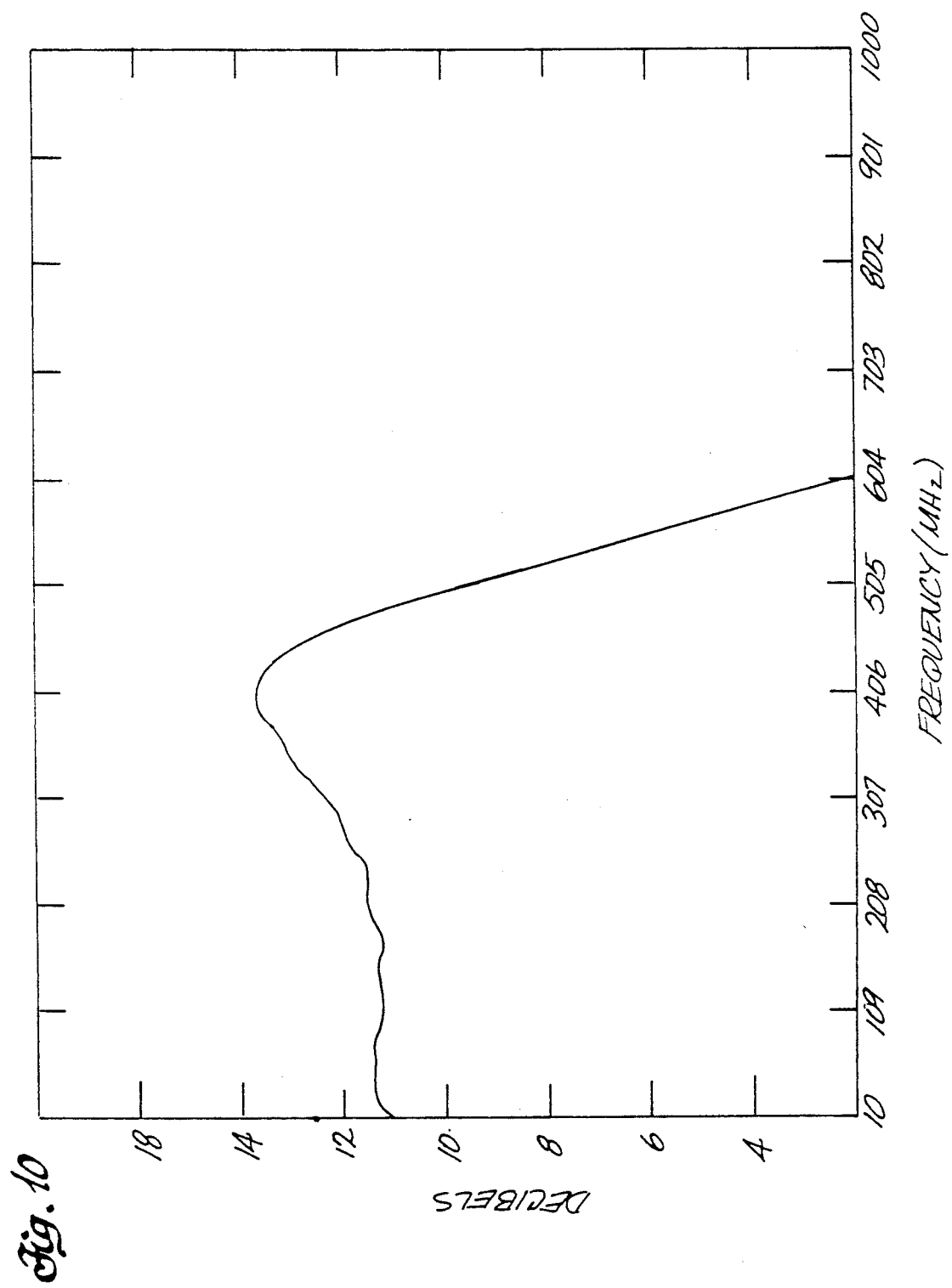
FIG. 10 is a graph showing performance of another embodiment of FIG. 7.

The use of a 460 nH series inductor and a 20:1 ratio transformer has also been tested and found to result in an increased gain from 10 MHz to 400 MHz as can be seen in FIG. 10. The use of other values of the series inductor and transformer impedance ratio will allow the tuning of the optical receiver for other ranges of frequencies.

Another preferred embodiment of the invention may be seen in FIG. 11. A PIN diode 32 with a capacitance of 0.5 pF connected in series with an inductor 34 is used. The higher capacitance of this photodiode requires a different passive tuning network than the preceding embodiments. The circuit in FIG. 11 is similar to the circuit in FIG. 7 except that an L-C shunt is added and a 12:1 ratio transformer is used to improve the high frequency response of the optical receiver. The L-C circuit consists of a shunt inductor 18 and a capacitor 20 connected across the first winding of the transformer 216.

A capacitor 242 is connected in series between the interconnected wires 226 and 228 and the input to the amplifier 222.

The second end 230 of the secondary winding of the transformer is connected to one electrode of a capacitor 241 while other electrode of the capacitor 241 is connected to ground. A bias voltage $V_{BIAS}$ is also applied to the second end 230 of the secondary winding.

Figure 12:
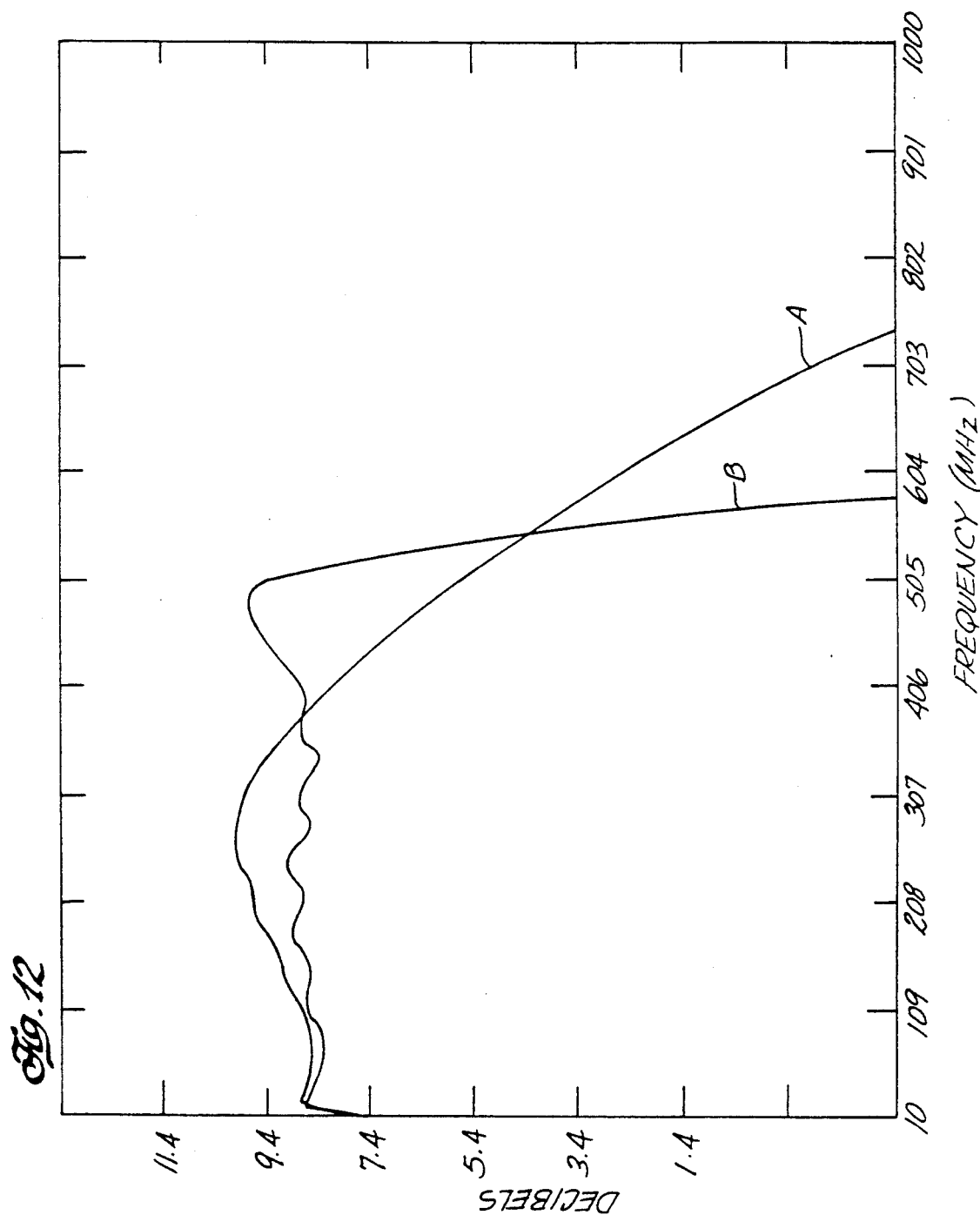
FIG. 12 is a graph showing performance of the embodiment shown in FIG. 11.

As can be seen by FIG. 12, the tuning effect of the L-C shunt circuit flattens and extends the high frequency response of the optical receiver. The trade-off for this improvement is that once the gain begins to be reduced as frequency continues to be increased, it falls even more steeply than in the circuit in the embodiments without the L-C shunt.

The operational value of the shunt inductor is from 100 to 1000 nH, with a preferred value of 210 nH. The operational value of the capacitor is from 0.05 pico Farad (pF) to 1 pF, with a preferred value of 0.2 pF. The values of the shunt inductor and the capacitor have been chosen to provide a relatively flat frequency response curve from 50 MHz to 550 MHz for a specific circuit constructed for test. Different values may be chosen to optimize frequency response over a different range of frequencies. Because component placement and the length of connecting leads will affect circuit operation, the values of the shunt inductor and the capacitor will vary based on the inherent inductance and capacitance of the circuit as built. Due to the extremely low capacitance value needed, the required capacitance may be found to be inherent in the capacitive effects of the component layout. When this occurs the capacitor, as a discrete component, may be omitted from the circuit. It will also be recognized that the components and leads have some resistance. Discrete resistors may also be used in the passive tuning network for obtaining flat response from the optical receiver.

Figure 13:
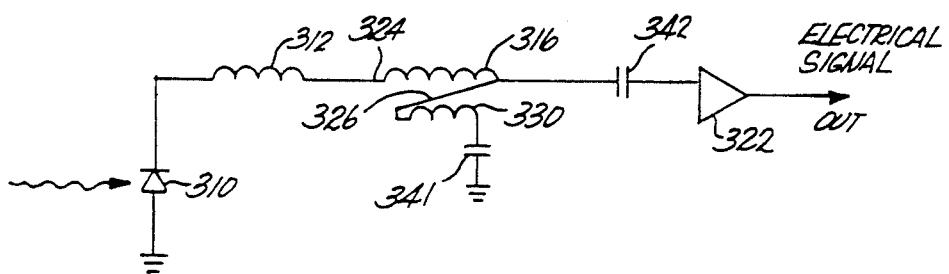
FIG. 13 is a schematic diagram of a third preferred embodiment of the invention.

Referring now to FIG. 13, a circuit configuration is shown which is the preferred configuration when using the broadband optical receiver with a 75 ohm load impedance. This embodiment is similar to the circuit shown in FIG. 7 with different values. A bias capacitor 341 is added in shunt with the transformer 316 and a series capacitor 342 is added in series between the transformer and the input to the RF amplifier 322.

Specifically, a PIN photodiode 310 has its anode connected to ground and its cathode connected to one terminal of a series inductor 312. The other terminal of the series inductor is connected to the primary winding 324 of the transformer. The interconnected wires of the transformer 328 and 328 are connected to one electrode of the series capacitor 342, the other electrode of the series capacitor being connected to the input of the RF amplifier 322. Further, the bias capacitor 341 is connected between the secondary winding 330 of the transformer and ground. A bias voltage $V_{BIAS}$ is applied to the electrode of the capacitor which is connected to the transformer.

Figure 14:
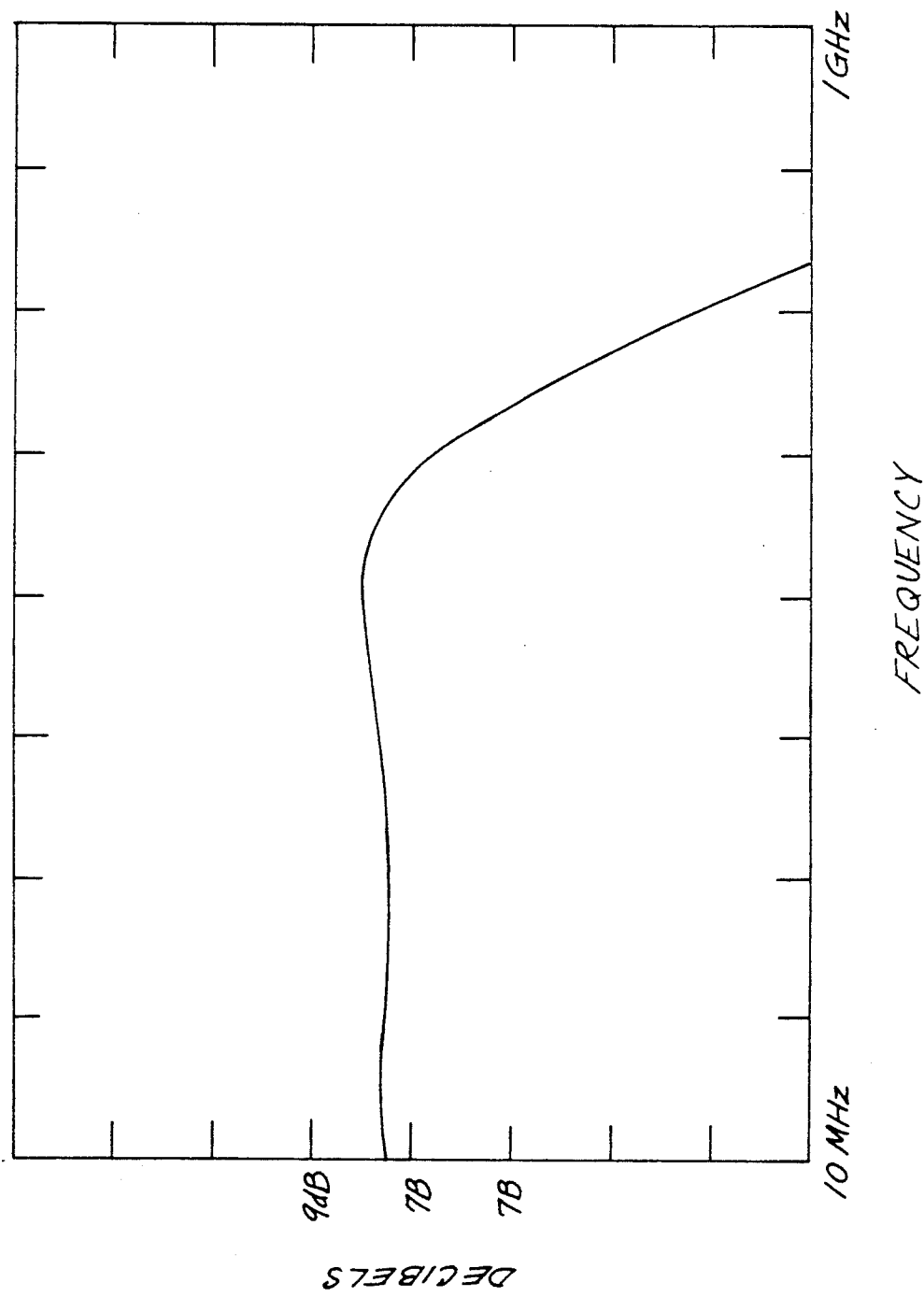
FIG. 14 is a graph showing performance of the embodiment shown in FIG. 13.

The embodiment of FIG. 13 utilizes a 200 nH series inductor 312, a 1200 pF series capacitor 42 and a 4.5:2 winding ratio, wound with 40 gauge wire, on the transformer 316. Referring to FIG. 14, this embodiment provides a very flat response with approximately 7.5 to 8.0 dB of gain over the frequency range of from 10 MHz to 550 Mhz.

Figure 15:
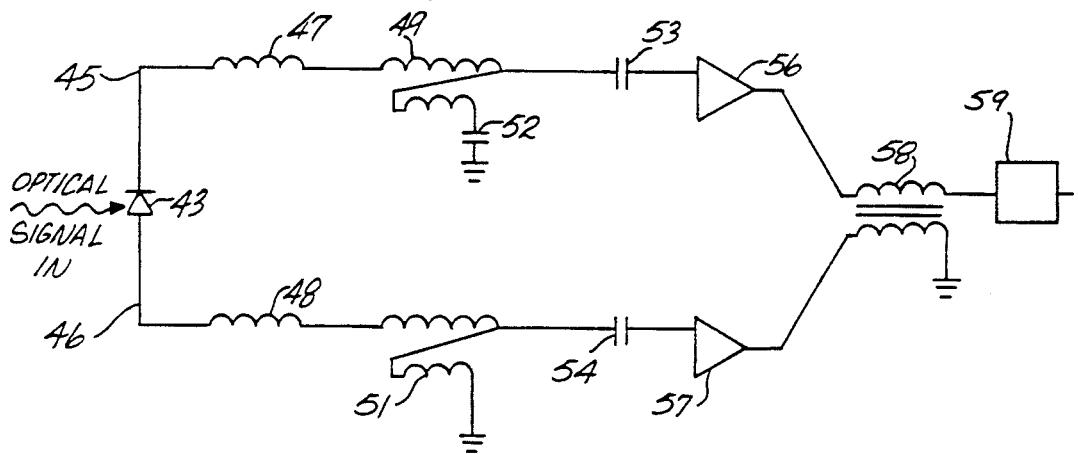
FIG. 15 is a schematic diagram of a fourth preferred embodiment of the invention.

Still another preferred embodiment is shown in FIG. 15. A PIN photodiode 43 having an anode and a cathode is connected to two similar parallel circuit branches 45 and 46. Specifically, the cathode of the PIN photodiode is connected to a first terminal of a first series inductor 47 and the anode of the PIN diode is connected to a first terminal of a second series inductor 48. Each of the series inductors are, in turn, connected to the primary windings of first and second transformers 49 and 51, respectively.

Both of the transformers are substantially similar to the transformers previously described above in that each has primary and secondary windings. One end of each of the first and second windings are interconnected with each other forming the output of the transformers. The opposite ends of each winding are independently connected to circuit elements.

The second winding of the first transformer 49 is connected to a first electrode of a bias capacitor 52 and to a bias voltage $V_{BIAS}$. The second electrode of the bias capacitor is connected to ground. The second winding of the second transformer 51 is also connected to ground.

The interconnected windings of the first transformer 49 are connected to a first electrode of a first series capacitor 53. Similarly, the interconnected windings of the second transformer 51 are connected to a first electrode of a second series capacitor 54. The second electrode of each of the series capacitors 53 and 54 are connected to the input of a first and second RF amplifier 56 and 57 respectively.

Finally, the outputs of the first and second amplifiers are combined with a 180° combiner 58 and the output of the combiner is fed into a resistive pad 59. The resistive pad is a network of resistors used for impedance matching the optical receiver circuit to the load circuit connected to the output of the optical receiver. An exemplary resistive pad is a T-resistive pad comprising a first resistor having a first terminal connected to the combiner 58, a second resistor connector between the second terminal of the first resistor and ground, and a third resistor connected between the second terminal of the first resistor and the output of the receiver. These resistors are selected to properly attenuate the combined signal and to properly match the output impedance of the optical receiver to the load (i.e. 50 or 75 ohms).

The series components of each branch of the circuit, taken independent of each other, operate similarly to the circuits in the above described embodiments. However, taken together, the preferred embodiment provides an improved circuit with a broader power output range and reduced distortion.

This occurs because the signal generated at the two terminals of the PIN diode are 180° out of phase. After each of these signals is amplified and the signals are recombined, the even order distortion products from the amplifiers will cancel. To achieve the best results, it is preferred that the amplifiers are not balanced since balancing the amplifiers will produce an output distortion equal to the amplified diode distortion. Rather, it is desired to slightly unbalance the amplifiers so that the second order distortion of the amplifiers cancels that of the photodiode.

One advantage of the circuit of the present invention is that it eliminates the need for an R-F splitter between the photodiode and the balanced amplifier stages of a high dynamic range push-pull amplifier. A high dynamic range amplifier typically has a 180° splitter at its input to generate out of phase signals. The splitter always causes some degree of attenuation of the signal. Since the present invention generates out of phase signals at the anode and cathode of the PIN photodiode, a splitter is not necessary, and the signal strength is preserved.

Further, the impedance ratios of the first and second transformers can be smaller while still maintaining the same noise performance as in a circuit generating the signal from only the cathode of the photodiode. The effective impedance that the PIN photodiode is driving in this embodiment is the sum of the impedances on the anode and cathode of the photodiode. Thus, each of the transformers in this embodiment has impedance ratios equal to half of what would be necessary in a circuit with only one transformer. This is advantageous since it is easier to build lower impedance ratio transformers. Additionally, lower impedance ratio transformers have less insertion loss.

There are various ways in which the amplifiers can be purposely unbalanced. For example, in one embodiment, the amplifiers are unbalanced by biasing the amplifiers differently. In another embodiment, the amplifiers are unbalanced by using feedback on one of the amplifiers. In still another embodiment, the same result is accomplished by introducing RF loss in series with one of the amplifiers.

The operational value of the first and second series inductors 47 and 48 is from 0 to 1000 nH, with a preferred value of 100 nH. The operational impedance ratio for the first and second transformers 49 and 51 is from 2:1 to 100:1, with a preferred ratio of 4:1 and a 3.5:3.5 turns ratio. Preferred values are chosen for a circuit having a 550 MHz bandwidth.

Various other photodetectors will require various other passive tuning networks and transformer ratios for optimum performance. Additionally, as can be appreciated by one skilled in the art, other passive tuning networks and other transformer designs may also be successfully used with the embodiments discussed above. Although described in the context of a 75 ohm input impedance hybrid television frequency amplifier, it will be apparent that principles of this invention are applicable to other amplifiers. For example, it is suitable for use with conventional 50 ohm impedance amplifiers.

In addition, tuning of the sort mentioned with respect to FIG. 11 may be included in a balanced amplifier embodiment such as described and illustrated in FIG. 13. In such an embodiment, a tuning circuit is used in each of the two paths of the impedance matching circuit. It may also be desirable to flatten response of the impedance matching circuit to damp peaks that occur, particularly at high frequencies, by adding shunt resistors around the series inductors 47 and 48 in FIG. 13 and comparable inductors in the other embodiments.

Many other modifications and variations will be apparent to one skilled in the art, and it is therefore to be understood that, within the scope of the appended claims, this invention may be practiced otherwise than as specifically described.

What is claimed is:

1. A broadband R-F optical receiver comprising:
   a photodetector having an output with an impedance for converting a broadband R-F optical signal to a broadband R-F electrical signal;
   means having an input with an impedance lower relative to the photodetector impedance for amplifying the electrical signal from the photodetector;
   means for connecting and matching the impedance of the output of the photodetector with the input impedance of the amplifying means, the impedance matching means being a transformer having an input connected to the photodetector and an output connected to the amplifying means; and
   means for supplying a bias voltage to the transformer comprising a bias capacitor connected between the transformer and ground and a bias voltage applied to the connection between the capacitor and the transformer.

2. A broadband R-F optical receiver as recited in claim 1 further comprising means for cancelling distortion products generated from the signals.

3. A broadband R-F optical receiver as recited in claim 2 wherein the photodetector generates two signals being 180° out of phase.

4. A broadband R-F optical receiver as recited in claim 3 wherein the amplifying means comprise a first and second amplifier, each amplifier for amplifying one of the signals output from the photodetector.

5. A broadband R-F optical receiver as recited in claim 4 wherein the means for cancelling comprises a combiner connected to the outputs of each of the first and second amplifiers.

6. A broadband R-F optical receiver as recited in claim 5 wherein the means for cancelling further comprises means for slightly unbalancing the first and second amplifiers so that the even order distortion products of the first and second amplifiers will cancel when combined.

7. A broadband R-F optical receiver comprising:
   a photodiode having two electrodes, the first electrode being connected to electrical ground;
   an R-F amplifier having an input, an output, and an input impedance substantially different from the impedance of the photodiode;
   a ferromagnetic transformer having first and second windings, the first winding being connected between the second electrode of the photodiode and the input of the amplifier, and the second winding of the transformer being connected between the input of the amplifier and the electrical ground.

8. The broadband R-F optical receiver of claim 7 wherein the photodiode is a PIN diode.

9. The broadband optical receiver of claim 7 wherein the amplifier is a hybrid cable television amplifier.

10. The broadband optical receiver of claim 9 wherein the amplifier has a gain factor sufficient to drive the input of a television receiver, an output impedance of from 50 to 75 ohms in the frequency range of from 10 MHz to 550 MHz, a noise figure of less than 8 dB and distortion at least 50 dB below the signal level.

11. The broadband optical receiver of claim 9 wherein the bandwidth of the receiver extends from 10 MHz to 550 MHz.

12. A broadband R-F optical receiver comprising:
   a photodiode having two electrodes, the first electrode being connected to electrical ground;
   an R-F amplifier having an input, an output, and an input impedance substantially different from the impedance of the photodiode;
   a transformer having a ferromagnetic core having a first side and second side with two openings therethrough and a center web between the openings;

the first winding having first and second ends and being wrapped one to ten times around the center web of the transformer, its first end being connected to the photodiode; and the second winding having a first end and second end and wrapped one to ten times around the center web of the transformer, the first end of the second winding being connected to the second end of the first winding and to the input of the amplifier, and the second end of the second being winding connected to the ground.

13. A broadband R-F optical receiver comprising:
a photodiode having two electrodes, the first electrode being connected to electrical ground;
an R-F amplifier having an input, an output, and an input impedance substantially different from the impedance of the photodiode;
a transformer having a ferromagnetic core in the shape of a torus and first and second windings;
the first winding having first and second ends and being wrapped one to ten times around the core, its first end being connected to the photodiode; and
the second winding having first and second ends being and wrapped around the core, the first end of the second winding being connected to the second end of the first winding and to the input of the amplifier, and the second end of the second winding being connected to the ground.

14. A broadband R-F optical receiver comprising:
a photodiode having two electrodes, the first electrode being connected to electrical ground;
a series inductor having an input and output, its input being connected to the second electrode of the photodiode;
a ferromagnetic transformer having first and second windings, the first winding being connected between the output of the series inductor and a first end of the second winding, a second end of the second winding being connected to the ground; and
an R-F amplifier having an input, an output, and an input impedance substantially different from the impedance of the photodiode, with its input being connected to the first end of the second winding of the transformer.

15. The broadband R-F optical receiver of claim 14 wherein the photodiode is a PIN diode.

16. The broadband R-F optical receiver of claim 14 wherein the series inductor has a value in the range of from 20 to 1000 nH.

17. The broadband R-F optical receiver of claim 14 wherein the transformer has an impedance ratio of from 2:1 to 100:1.

18. The broadband optical receiver of claim 14 wherein the amplifier is a hybrid cable television amplifier.

19. The broadband optical receiver of claim 14 wherein the amplifier has a gain factor sufficient to drive the input of a television receiver, an output impedance of from 50 to 75 ohms in the frequency range of from 10 MHz to 550 MHz, a noise figure of less than 8 dB and distortion at least 50 dB below the signal level.

20. The broadband optical receiver of claim 14 wherein the bandwidth of the receiver extends from 50 MHz to 550 MHz.

21. The broadband R-F optical receiver of claim 14 further comprising:

a shunt inductor and means for providing capacitance, in series between the output of the series inductor and ground.

22. The broadband R-F optical receiver of claim 21 wherein the shunt inductor has a value in the range of from 100 to 1000 nH.

23. The broadband R-F optical receiver of claim 21 wherein the capacitance means has a value in the range of 0.05 to 1 pF.

24. The broadband R-F optical receiver of claim 21 wherein the capacitance means is a capacitor having a value in the range of 0.05 to 1 pF.

25. A broadband R-F optical receiver comprising:
a photodiode having two electrodes, the first electrode being connected to electrical ground;
a series inductor having an input and output, its input being connected to the second electrode of the photodiode;
the transformer having a ferromagnetic core and first and second windings;
the ferromagnetic core having a first side and second side with two openings therethrough and a center web between the openings;
the first winding having first and second ends and being wrapped one to ten times around the center web of the transformer, its first end being connected to the photodiode;
the second winding having a first and second ends ad wrapped one to ten times around the center web of the transformer, the first end of the second winding being connected to the second end of the first winding and to the input of an R-F amplifier, and the second end of the second winding being connected to the ground; and
the R-F amplifier having an input, an output, and an input impedance substantially different from the impedance of the photodiode, with its input being connected to the first end of the second winding of the transformer.

26. A broadband R-F optical receiver comprising:
a photodiode having two electrodes, the first electrode being connected to electrical ground;
a series inductor having an input and output, its input being connected to the second electrode of the photodiode;
the transformer having a ferromagnetic core and first and second windings;
the ferromagnetic core being in the shape of a torus;
the first winding having first and second ends and being wrapped one to ten times around the core, its first end being connected to the photodiode;
the second winding having first and second ends and being wrapped around the core, the first end of the second winding being connected to the second end of the first winding and to the input of an R-F amplifier, and the second end of the second winding being connected to the ground; and
the R-F amplifier having an input, an output, and an input impedance substantially different from the impedance of the photodiode, with its input being connected to the first end of the second winding of the transformer.

27. A broadband R-F optical receiver comprising:
a photodiode having two electrodes, the first electrode being connected to electrical ground;
a series inductor having an input and output, its input being connected to the second electrode of the photodiode;

a transformer having first windings with first and second ends and second windings with first and second ends, the first winding being connected between the output of the series inductor and the first end of the second winding;

a series capacitor having an input and output, its input being connected to the first end of the second winding of the transformer;

an R-F amplifier having an input, an output, and an input impedance substantially different from the impedance of the photodiode, with its input being connected to the output of the series capacitor;

a bias capacitor having one electrode connected to the second end of the second winding and its other electrode being connected to the ground; and means for applying a bias voltage to the electrode of the capacitor which is connected to the second end of the second winding.

28. The broadband R-F optical receiver of claim 27 wherein the photodiode is a PIN diode.

29. The broadband R-F optical receiver of claim 27 wherein the transformer has:

a ferromagnetic core having a first side and second side with two openings therethrough and a center web between the openings;

said first winding having the first and second ends and being wrapped one to ten times around the center web of the transformer, its first end being connected to the photodiode; and said second winding having the first end and the second end and being wrapped one to ten times around the center web of the transformer, the first end of the second winding being connected to the second end of the first winding and to the input of the amplifier, and the second end of the second winding being connected to ground.

30. The broadband R-F optical receiver of claim 27 wherein the transformer has:

a ferromagnetic core in the shape of a torus;

said first winding having the first and second ends and being wrapped one to ten times around the core, its first end being connected to the photodiode; and p1 said second winding having the first and second ends and being wrapped around core, the first end of the second winding being connected to the second end of the first winding and to the input of the amplifier, and the second end of the second winding being connected to ground.

31. The broadband R-F optical receiver of claim 27 wherein the series inductor has a value in the range of from 20 to 1000 nH.

32. The broadband R-F optical receiver of claim 27 wherein the transformer has an impedance ratio of from 2:1 to 100:1.

33. The broadband optical receiver of claim 27 wherein the amplifier is a hybrid cable television amplifier.

34. The broadband optical receiver of claim 27 wherein the amplifier has a gain factor sufficient to drive the input of a television receiver, an output impedance of 75 ohms in the frequency range of from 10 MHz to 550 MHz, a noise figure of less than 8 dB and distortion at least 50 dB below the signal level.

35. The broadband optical receiver of claim 27 wherein the bandwidth of the receiver extends from 50 MHz to 550 MHz.

* * * * *